United States Patent [19] [11] 4,207,963
Klasco [45] Jun. 17, 1980

[54] LOUDSPEAKER SYSTEM

[75] Inventor: Michael Klasco, New York, N.Y.

[73] Assignee: Integrated Sound Systems Inc., Long Island City, N.Y.

[21] Appl. No.: 969,390

[22] Filed: Dec. 11, 1978

[51] Int. Cl.² .......... H05K 5/00
[52] U.S. Cl. .......... 181/147; 181/163; 181/155; 181/199
[58] Field of Search .......... 181/147, 163, 144, 145, 181/146, 148, 155, 196, 156, 199; 179/1 E

[56] References Cited

U.S. PATENT DOCUMENTS

| | | | |
|---|---|---|---|
| 2,646,851 | 7/1953 | Chapman et al. | 181/155 |
| 2,713,396 | 7/1955 | Tavares | 181/163 |
| 3,125,181 | 3/1964 | Pawlowski | 181/147 |

FOREIGN PATENT DOCUMENTS

| | | | |
|---|---|---|---|
| 2656192 | 3/1978 | Fed. Rep. of Germany | 179/1 E |
| 45-8074 | 3/1970 | Japan | 179/1 E |

*Primary Examiner*—L. T. Hix
*Assistant Examiner*—Benjamin R. Fuller

[57] ABSTRACT

A compact portable high acoustic power loudspeaker system is described. A plurality of speakers are mounted inside an enclosure which is sealed. A passive radiator is also provided which is symmetrically disposed inside the enclosure relative to the speakers so as to be subjected to a generally uniform acoustic loading. A high compliance radiator is employed by dispensing with a central spider radiator support with a mass selected to obtain a high efficiency and good low frequency response. A foam gasket is used to help seal the enclosure while also serving to disperse high frequency sound and improve acoustic coupling opposite high frequency speakers.

5 Claims, 4 Drawing Figures

LOUDSPEAKER SYSTEM

FIELD OF THE INVENTION

This invention relates to a loudspeaker system.

BACKGROUND OF THE INVENTION

Loudspeaker systems capable of generating large power outputs have been developed using several loud speakers, see for example the loudspeaker systems described in U.S. Pat. No. 3,582,553 to Bose or U.S. Pat. No. 4,031,318 to Pitre. When large output power is to be achieved with small enclosures, radiation from the back of the cones of small speakers often becomes a source of distortion; hence, absorbent materials are employed to reduce this effect. The absorbent material, however, alters the frequency response of the speaker system, usually causing an excessive amount of droop at low frequencies.

Techniques have been proposed to improve the low frequency response and efficiency of a small speaker system. In one technique, such as described in the U.S. Pat. No. 3,952,159 to Schott, a bass-reflex speaker enclosure is described with a ducted port to reduce low frequency distortion. In the U.S. Pat. No. 1,988,250 to Olson and U.S. Pat. No. 3,780,824 to Prince, high compliance passive radiators are employed in a fluid-tight enclosure to improve the low frequency response of the speaker system. A pair of symmetrically disposed passive radiators are shown in Olson for better appearance.

SUMMARY OF THE INVENTION

With a loudspeaker system in accordance with the invention, a fluid-tight speaker enclosure is used with a plurality of speakers and a passive radiator in an arrangement which provides good low frequency response and efficiency with low distortion.

This is achieved by employing a passive radiator with high compliance and relative low mass and locating the speakers symmetrically relative to the radiator for balanced loading thereof. In this manner a central spider support for the passive radiator can be dispensed without incurring excessive wobbling motions which would detract from the sound quality of the speaker system.

As described herein with respect to one loudspeaker system in accordance with the invention, the passive radiator is mounted over an opening in the rear wall of a rectangular speaker enclosure. The passive radiator is attached with a peripheral support, known as a surround, without the use of a central support, known as a spider. The deletion of the spider advantageously increases compliance of the passive radiator with a lower mass and thus improves the low frequency behavior of the loudspeaker system.

Since a spider stabilizes the passive radiator, spider deletion is likely to lead to wobbling motions causing a loss of efficiency to the system and degrade the quality of the sound. With a loudspeaker system in accordance with the invention, however, a symmetrical mounting of the speakers relative to the passive radiator balances the dynamic load on the latter, thus reducing asymmetrical air turbulence and rocking of the passive radiator, while enabling the use of a high compliance, low mass passive radiator to achieve a high efficiency with good low frequency performance.

It is, therefore, an object of the invention to provide a compact loudspeaker system capable of generating a high volume output with a relatively flat frequency response and good efficiency.

These and other advantages and objects of the invention can be understood from the following detailed description of a preferred embodiment described in conjunction with the drawings.

DETAILED DESCRIPTION OF EMBODIMENT

Figures 1, 2:
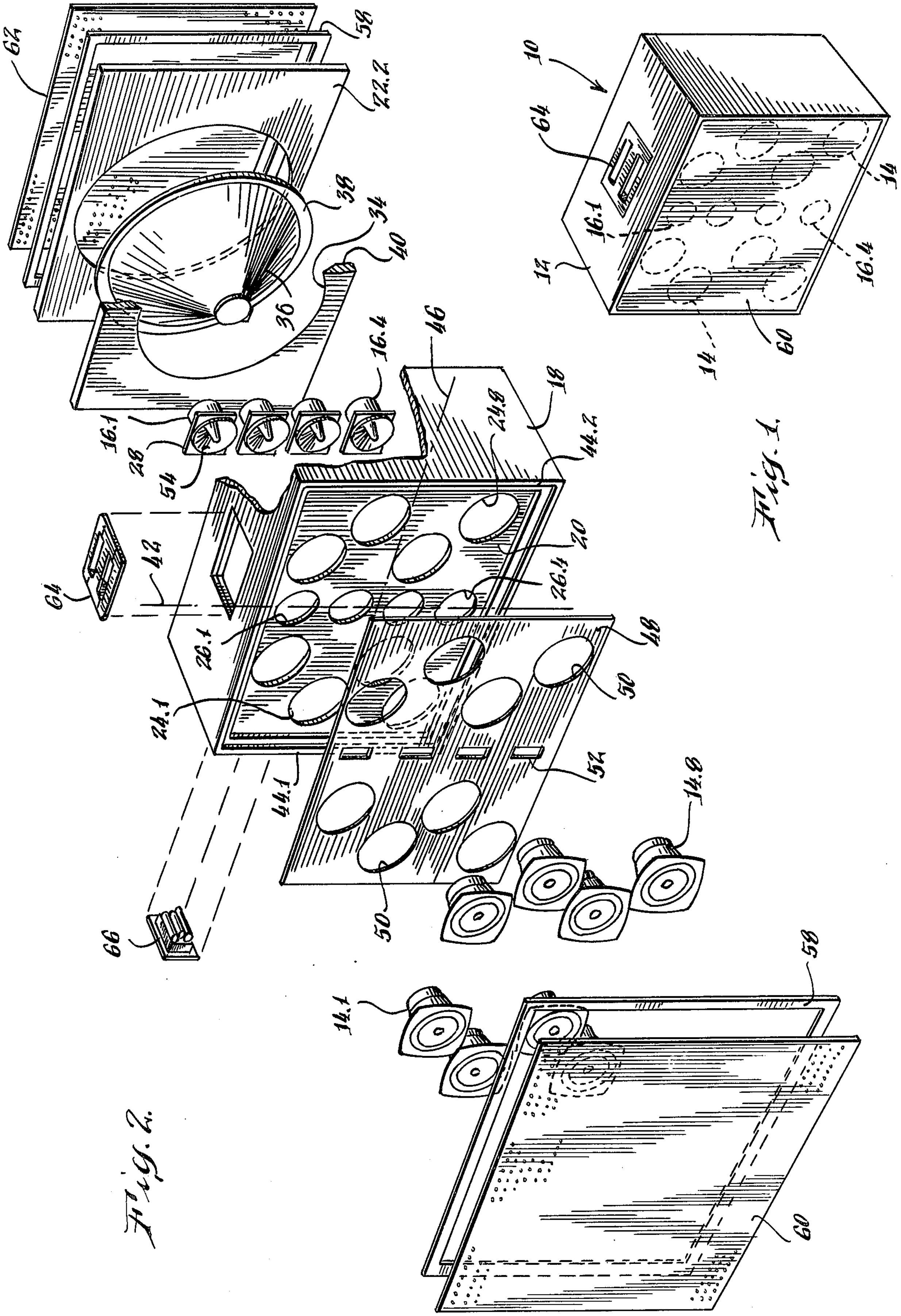
FIG. 1 is a perspective view of a loudspeaker system in accordance with the invention.
FIG. 2 is a perspective exploded view of the loudspeaker system of FIG. 1.

With reference to FIGS. 1 and 2, a compact loudspeaker system 10 in accordance with the invention is shown formed with a rectangular enclosure 12. The system 10 is formed with a plurality of low and mid-frequency range speakers 14, and high frequency speakers 16 (tweeters).

The enclosure 12 is formed with a wood perimeter frame 18 which has a wood front wall 20 and a wood rear wall 22. The front wall has a plurality of speaker openings 24, 26 to respectively receive low and mid-range speakers 14 and tweeters 16. The tweeters 16 have flanges 28 which provide mounting surfaces to glue the tweeters to the inner surface 30 (see FIG. 4) of front wall 20. The speakers 14 are mounted with screws 33 to the outer surface 32 (see FIG. 4) of front wall 20.

The rear wall 22 has a radiator opening 34 opposite which a passive radiator 36 is mounted. The radiator 36 is supported around its peripheral rim 38 such as by glueing it in place to an annular support surface 40 of rear wall 22.

Figure 3:
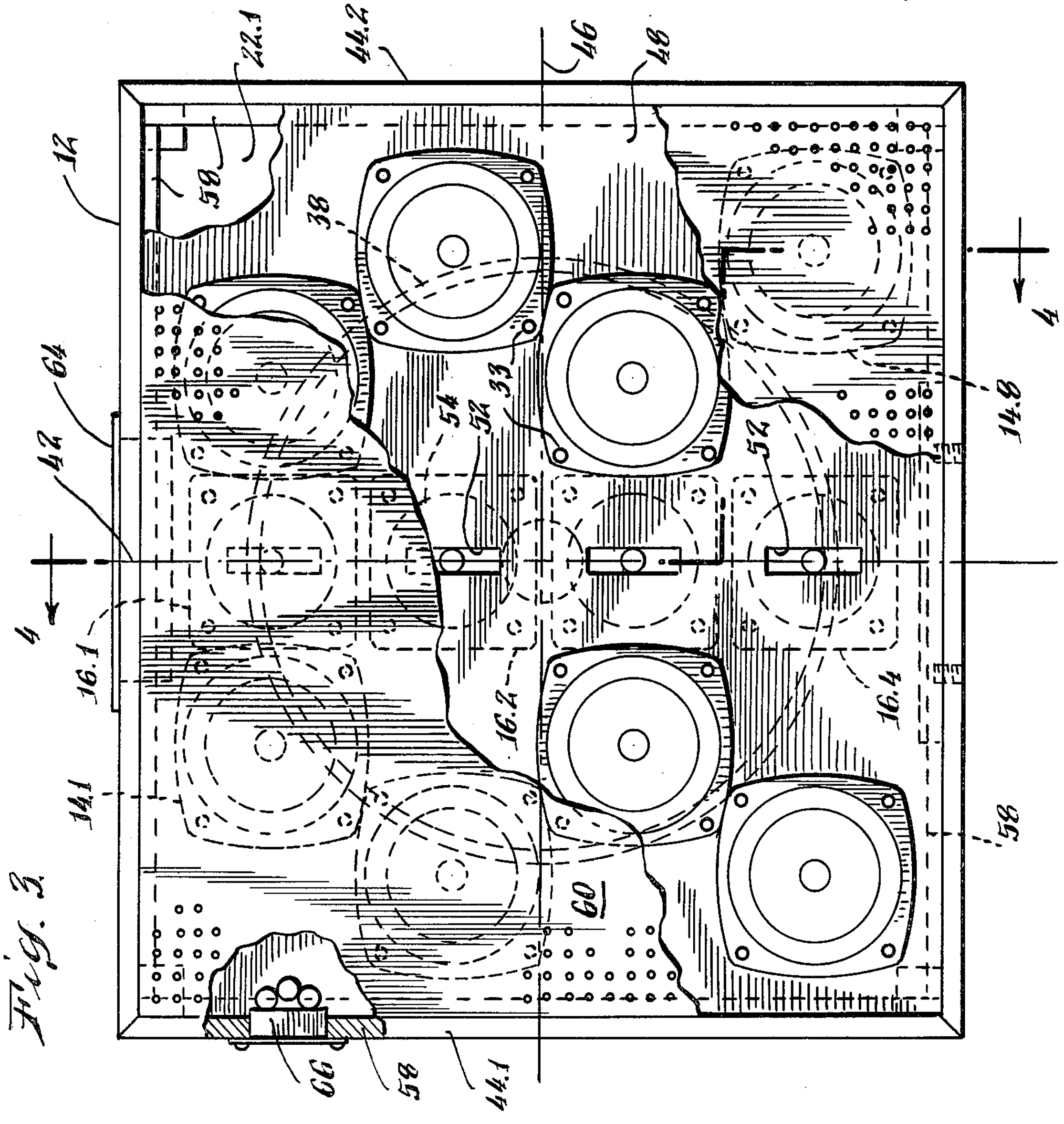
FIG. 3 is a front view in elevation of the loudspeaker system of FIG. 1.

The speakers 14, 16 are symmetrically located as more clearly illustrated in FIG. 3. The low and mid-range speakers 14 are symmetrically placed on both sides of vertical center line 42 towards the side walls 44.1, 44.2 as well as evenly distributed above and below a horizontal center line 46. The high frequency tweeters 16 are symmetrically located on the vertical center line 42 and also evenly spaced above and below the horizontal line 46. The passive radiator 36 is symmetrically located on rear wall 22 relative to vertical and horizontal center lines 42, 46. Hence, back radiation from speakers 14, 16 is evenly distributed over passive radiator 36 by virtue that the air paths and friction from correspondingly located speakers to the radiator 36 is about equal.

A foam gasket 48 is provided and sized to fit over front wall 20 to which gasket 48 is laminated. Gasket 48 has die cut-outs 50 located to align with speakers 14 and die cuts 52 located to align opposite tweeters 16. Die cut-outs 50 have the same general size as the openings 24 for speakers 14. Die cut-outs 52, however, are in the form of rectangular slots, whose opening area is substantially less than the surface area of the cone opening 54 of tweeters 16.

Die cut-outs 52 assure a partial acoustic blockage in front of tweeters 16. This increases angular diffraction of the high frequency sound from tweeters 16 to approach the angular sound dispersion from the mid-range speakers 14. In addition, the partially blocking foam in front of tweeters 16 increases the acoustic impedance of the space in front of tweeters, thus enhancing acoustic coupling and the efficiency of the tweeters 16. The width of slots 52 are selected commensurate with a desired angular sound dispersion caused by diffraction commencing at a frequency of interest. Thus, slots 52 may have an average width of three-quarters of an inch commensurate with the angular dispersion of sound frequencies starting at about above 8 KHz. When slots 52 are about one and a half to about two inches wide, the dispersion commences at about 4 KHz. With the slots oriented and shaped as shown, the angular dispersion is greater in a horizontal plane than a vertical plane. Differently shaped slots 52 can be used.

Figure 4:
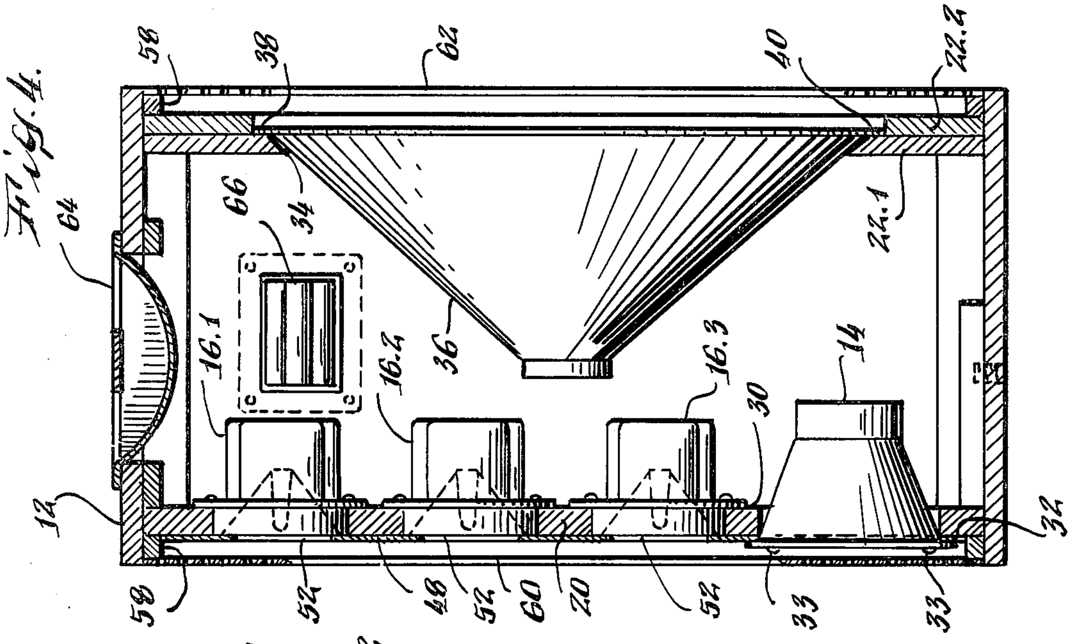
FIG. 4 is a section view of the loudspeaker system of FIG. 1 taken along the line 4—4 in FIG. 3.

The low and mid-frequency range speakers 14 are mounted in such manner that, as illustrated in FIG. 4, the foam gasket 48 is compressively clamped between speakers 14 and front wall 20 to seal enclosure 12. Felt borders 58 are provided in front of walls 20 and 22 and metal screens 60, 62 are mounted respectively in front of front and rear walls 20, 22.

A metal carrying handle 64 is provided which seats recessed into the enclosure 12 while presenting a complete closure to preserve the integrity of the fluid tightness of enclosure 12. An electrical cross-over network 66 is mounted inside enclosure 12 to side wall 44.1. The respective speakers 14 and 16 are driven in phase with each other.

With a loudspeaker system in accordance with the invention, a large volume of acoustic power can be produced with high quality sound and with a light weight, compact portable structure. For example, with mid-range speakers 14 of about five inch diameter, several hundred watts of power can be generated with an enclosure 12 measuring of the order of about ten inches deep, nineteen inches wide and twenty-one inches high with a total weight of about forty pounds. With a symmetrically located passive radiator of about fifteen inches in diameter and having a mass of the order of about forty grams and being somewhat less than one-eighth of an inch thick, a generally flat frequency response from about 55 Hz to about 20,000 Hz was obtained with low harmonic distortion.

Having thus described a loudspeaker in accordance with the invention, its advantages can be appreciated. Variations from the described embodiment can be made, with the scope of the invention to be determined by the following claims.

What is claimed is:

1. In a loudspeaker system formed of a plurality of speakers inside a fluid tight cabinet, the improvement comprising a substantially fluid tight cabinet having a front wall and an oppositely spaced rear wall which is generally parallel to the front wall, said front wall having a plurality of speaker openings and said rear wall having a substantial radiator opening for rearward projection of sound from said cabinet;

a plurality of low and mid-range frequency speakers sealingly mounted to the front wall opposite speaker openings;

a plurality of high frequency range speakers sealingly mounted to the front wall opposite speaker openings therein;

a passive radiator sealingly mounted opposite the radiator opening of the rear wall to project sound towards the rear from said cabinet, said radiator further being mounted in a generally symmetrical manner relative to both said low and mid-range frequency speakers and said high frequency speakers to impart balanced loads on said passive radiator, said passive radiator beng peripherally mounted to the rear wall without central support for improved flat frequency response, said passive radiator further being so sized to enable at least partial absorption of acoustic energy of mid-range frequencies produced from the back of said low and mid-range speakers.

2. The loudspeaker system as claimed in claim 1 wherein said front wall is formed with a foam gasket in front of said speakers, said foam gasket having die cuts opposite the speakers with a die cut opposite a high frequency range speaker being shaped to diffract sound therefrom to obtain an angular dispersion of the mid-range speakers and to present an increased mechanical impedance for a smooth high frequency response.

3. The loudspeaker system as claimed in claim 2 wherein the die cut opposite a high frequency speaker is in the form of a longitudinal slot which has a width substantially less than the diameter of the high frequency speaker and is generally centrally disposed relative to said high frequency speaker.

4. The loudspeaker system as claimed in claim 3 wherein the passive radiator is round and is sized to occupy a surface area of the order of at least forty percent of the surface area of the rear wall of the cabinet.

5. The loudspeaker system as claimed in claim 1 wherein said low and mid-range speakers and said high frequency speakers are symmetrically located relative to horizontal and vertical center lines of said front wall.

* * * * *